United States Patent
Patel et al.

(10) Patent No.: US 8,334,784 B2
(45) Date of Patent: *Dec. 18, 2012

(54) DETECTING ACTUATION OF ELECTRICAL DEVICES USING ELECTRICAL NOISE OVER A POWER LINE

(75) Inventors: Shwetak N. Patel, Seattle, WA (US); Thomas M. Robertson, Atlanta, GA (US); Gregory D. Abowd, Atlanta, GA (US); Matthew S. Reynolds, Durham, NC (US)

(73) Assignee: Belkin International Inc., Playa Vista, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/335,045

(22) Filed: Dec. 22, 2011

(65) Prior Publication Data

US 2012/0092142 A1    Apr. 19, 2012

Related U.S. Application Data

(63) Continuation of application No. 12/283,869, filed on Sep. 16, 2008, now Pat. No. 8,094,034.

(60) Provisional application No. 60/973,188, filed on Sep. 18, 2007.

(51) Int. Cl.
*G08B 21/00* (2006.01)

(52) U.S. Cl. .................. 340/657; 340/310.11; 340/644; 340/12.32

(58) Field of Classification Search .................. 340/657, 340/310.11, 644, 310.12, 12.32; 375/219, 375/220, 240.18, 240.19
See application file for complete search history.

(56) References Cited

U.S. PATENT DOCUMENTS

| 3,714,516 A | 1/1973 | Howe |
| 4,612,617 A | 9/1986 | Laplace, Jr. et al. |
| 4,804,957 A | 2/1989 | Selph et al. |
| 4,858,141 A | 8/1989 | Hart et al. |
| 5,276,629 A | 1/1994 | Reynolds |

(Continued)

FOREIGN PATENT DOCUMENTS

AR          070667          4/2010

(Continued)

OTHER PUBLICATIONS

Calwell, C. and Reeder, T., "Power Supplies: A Hidden Opportunity for Energy Savings," NRDC, May 22, 2002, 28 pages.

(Continued)

*Primary Examiner* — Anh V La
(74) *Attorney, Agent, or Firm* — Bryan Cave LLP

(57) ABSTRACT

Activity sensing in the home has a variety of important applications, including healthcare, entertainment, home automation, energy monitoring and post-occupancy research studies. Many existing systems for detecting occupant activity require large numbers of sensors, invasive vision systems, or extensive installation procedures. Disclosed is an approach that uses a single plug-in sensor to detect a variety of electrical events throughout the home. This sensor detects the electrical noise on residential power lines created by the abrupt switching of electrical devices and the noise created by certain devices while in operation. Machine learning techniques are used to recognize electrically noisy events such as turning on or off a particular light switch, a television set, or an electric stove. The system has been tested to evaluate system performance over time and in different types of houses. Results indicate that various electrical events can be learned and classified with accuracies ranging from 85-90%.

21 Claims, 7 Drawing Sheets

U.S. PATENT DOCUMENTS

| | | | |
|---|---|---|---|
| 5,409,037 | A | 4/1995 | Wheeler et al. |
| 5,441,070 | A | 8/1995 | Thompson |
| 5,483,153 | A | 1/1996 | Leeb et al. |
| 5,590,179 | A | 12/1996 | Shincovich et al. |
| 5,635,895 | A | 6/1997 | Murr |
| 5,717,325 | A | 2/1998 | Leeb et al. |
| 5,898,387 | A | 4/1999 | Davis et al. |
| 6,275,168 | B1 | 8/2001 | Slater et al. |
| 6,622,097 | B2 | 9/2003 | Hunter |
| 6,728,646 | B2 | 4/2004 | Howell et al. |
| 6,734,806 | B1 | 5/2004 | Cratsley |
| 6,816,078 | B2 | 11/2004 | Onoda et al. |
| 6,839,644 | B1 | 1/2005 | Bryant et al. |
| 6,853,291 | B1 | 2/2005 | Aisa |
| 6,906,617 | B1 | 6/2005 | Van der Meulen |
| 6,910,025 | B2 | 6/2005 | Cao |
| 6,993,417 | B2 | 1/2006 | Osann et al. |
| 7,019,666 | B2 | 3/2006 | Tootoonian Mashhad et al. |
| 7,043,380 | B2 | 5/2006 | Rodenberg, III et al. |
| 7,049,976 | B2 | 5/2006 | Hunt et al. |
| 7,133,729 | B1 * | 11/2006 | Wang et al. .................. 700/83 |
| 7,134,568 | B2 | 11/2006 | Moriyama et al. |
| 7,174,260 | B2 | 2/2007 | Tuff et al. |
| 7,276,915 | B1 | 10/2007 | Euler et al. |
| 7,330,796 | B2 | 2/2008 | Addink et al. |
| 7,400,986 | B2 | 7/2008 | Latham et al. |
| 7,460,930 | B1 | 12/2008 | Vinson et al. |
| 7,493,221 | B2 | 2/2009 | Caggiano et al. |
| 7,498,935 | B2 | 3/2009 | Kodama et al. |
| 7,508,318 | B2 | 3/2009 | Casella et al. |
| 7,541,941 | B2 | 6/2009 | Bogolea et al. |
| 7,546,214 | B2 | 6/2009 | Rivers, Jr. et al. |
| 7,589,942 | B2 | 9/2009 | Kumfer et al. |
| 7,612,971 | B2 | 11/2009 | Premerlani et al. |
| 7,656,649 | B2 | 2/2010 | Loy et al. |
| 7,692,555 | B2 | 4/2010 | Stanley et al. |
| 7,693,670 | B2 | 4/2010 | Durling et al. |
| 7,702,421 | B2 | 4/2010 | Sullivan et al. |
| 7,705,484 | B2 | 4/2010 | Horst |
| 7,706,928 | B1 | 4/2010 | Howell et al. |
| 7,719,257 | B2 | 5/2010 | Robarge et al. |
| 7,729,993 | B2 | 6/2010 | Baraty |
| 7,747,357 | B2 | 6/2010 | Murdoch |
| 7,885,917 | B2 | 2/2011 | Kuhns et al. |
| 7,889,061 | B2 | 2/2011 | Endo |
| 8,078,431 | B2 | 12/2011 | Brown |
| 8,094,034 | B2 | 1/2012 | Patel et al. |
| 2001/0003286 | A1 | 6/2001 | Philippbar et al. |
| 2003/0088527 | A1 | 5/2003 | Hung et al. |
| 2004/0128034 | A1 | 7/2004 | Lenker et al. |
| 2004/0140908 | A1 | 7/2004 | Gladwin et al. |
| 2004/0206405 | A1 | 10/2004 | Smith et al. |
| 2005/0067049 | A1 | 3/2005 | Fima et al. |
| 2006/0077046 | A1 | 4/2006 | Endo |
| 2006/0103549 | A1 | 5/2006 | Hunt et al. |
| 2008/0086394 | A1 | 4/2008 | O'Neil et al. |
| 2008/0091345 | A1 | 4/2008 | Patel et al. |
| 2008/0167755 | A1 | 7/2008 | Curt |
| 2008/0255782 | A1 | 10/2008 | Bilac et al. |
| 2010/0030393 | A1 | 2/2010 | Masters et al. |
| 2010/0070214 | A1 | 3/2010 | Hyde et al. |
| 2010/0070218 | A1 | 3/2010 | Hyde et al. |
| 2010/0109842 | A1 | 5/2010 | Patel et al. |
| 2010/0148579 | A1 | 6/2010 | Maloney |
| 2010/0188262 | A1 | 7/2010 | Reymann et al. |
| 2011/0004421 | A1 | 1/2011 | Rosewell et al. |

FOREIGN PATENT DOCUMENTS

| | | |
|---|---|---|
| CA | 2705528 | 5/2009 |
| CN | 101523226 | 9/2009 |
| CN | 101535819 | 9/2009 |
| CN | 101680676 | 3/2010 |
| DE | 102007032053 | 1/2009 |
| EP | 1136829 | 9/2001 |
| EP | 1444527 | 4/2004 |
| EP | 2171363 | 4/2010 |
| EP | 2174395 | 4/2010 |
| EP | 2188879 | 5/2010 |
| FR | 2645968 | 10/1990 |
| GB | 2461915 | 1/2010 |
| GB | 2465800 | 2/2010 |
| GB | 2464634 | 4/2010 |
| GB | 2464927 | 5/2010 |
| GB | 2465367 | 5/2010 |
| KR | 20090057058 | 6/2009 |
| KR | 20090057071 | 6/2009 |
| KR | 2010021458 | 2/2010 |
| KR | 20100021604 | 8/2011 |
| WO | WO9304377 | 3/1993 |
| WO | WO03003029 | 1/2003 |
| WO | WO2008042483 | 4/2008 |
| WO | WO2008153576 | 12/2008 |
| WO | WO2008153577 | 12/2008 |
| WO | WO2009040140 | 4/2009 |
| WO | WO2009063397 | 5/2009 |
| WO | WO2009081407 | 7/2009 |
| WO | WO2010007369 | 1/2010 |
| WO | WO2010062398 | 6/2010 |

OTHER PUBLICATIONS

Fogarty, J., Au, C. and Hudson, S., "Sensing from the Basement: A Feasibility Study of Unobtrusive and Low-Cost Home Activity Recognition," In the Proceedings of ACM Symposium on User Interface Software and Technology (UIST'06), Oct. 15-18, 2006, 10 pages.

Rosenblat, L., "The Basic Power Supply Tutorial: Design Concepts, Block Diagram, Theory of Operation," http://www.smps.us/power-supply.html, Jun. 8, 2010, 3 pages.

Hart, G., "Nonintrusive Appliance Load Monitoring," In the Proceedings of the IEEE, Dec. 1992, pp. 1870-1891.

Product Data Sheet for UBA2021 630 V driver IC for CFL and TL lamps, NXP Semiconductors, Jul. 25, 2008, 16 pages.

P3 International, "Kill A Watt™, Electricity Usage Monitor", Innovative Electronic Solutions, http://www.p3international.com/products/special/P4400/P4400-CE.html, 2008, 1 page.

Compliance Certification Services (Shenzhen) Inc., "FCC Class B Compliance Report," prepared for Jet Way Information Co., Ltd., Dec. 29, 2006, 20 pages.

Kim, Y., Schmid, T., Charbiwala, Z.M., and Srivastava, M.B., "ViridiScope: Design and Implementation of a Fine Grained Power Monitoring System for Homes," In the Proceedings of UbiComp, Sep. 30, 2009, 10 pages.

Lifton, J., Feldmeier, M., Ono, Y., Lewis, C., and Paradiso, J.A., "A Platform for Ubiquitous Sensor Deployment in Occupational and Domestic Environments," In the Proceedings of the 6th International Conference on Information Processing in Sensor Networks, Apr. 25, 2007, pp. 119-127.

Rubner, J., "Tech Professor Developing Camera Cloak," Atlanta Business Chronicle, Jun. 15, 2007, 2 pages.

Murph, D., "Electrical Noise Could Help Automate Your Home," Engadget, Sep. 12, 2007, 4 pages.

Kleiner, K., "'Smart Homes' Could Track Your Electrical Noise," New Scientist, Sep. 10, 2007, 2 pages.

"Study Finds Elder Care a Growing Emotional and Financial Burden for Baby Boomers," New ADT monitoring service for elderly helps ease the stress of long distance care giving, PR Newswire Europe, Mar. 29, 2005, 4 pages.

Burges, C., "A Tutorial on Support Vector Machines for Pattern Recognition," Journal of Data Mining and Knowledge Discovery, Jun. 1998, pp. 121-167, vol. 2, Kluwer Academic Publishers, Hingham, MA.

Chen, J., Kam, A., Zhang, J., Liu, N., and Shue, L., "Bathroom Activity Monitoring Based on Sound," Pervasive Computing, 2005, pp. 47-61.

Howell, E.K., "How Switches Produce Electrical Noise," IEEE Transactions on Electromagnetic Compatibility, Aug. 1979, pp. 162-170, vol. EMC-21, No. 3.

Weka 3—Data Mining with Open Source Machine Learning Software in Java, "Weka 3: Data Mining Software in Java," http://www.cs.waikato.ac.nz/ml/weka/, Mar. 2006, 1 page.

HomePlug Powerline Alliance, web.archive.org/web/20060225110208/www.homeplug.org/en/products/index.asp, 2006, 1 page.

Abowd, G., and Mynatt, E.D., "Charting Past, Present, and Future Research in Ubiquitous Computing," ACM Transactions on Computer-Human Interaction, Mar. 2000, pp. 29-58, vol. 7, No. 1.

Edwards, W.K., and Grinter, R.E., "At Home with Ubiquitous Computing: Seven Challenges," In the Proceedings of UbiComp 2001, Sep. 30-Oct. 2, 2001, 17 pages.

Crabtree, A., Rodden, T., Hemmings, T., and Benford, S., "Finding a Place for UbiComp in the Home," In the Proceedings of UbiComp 2003, Oct. 12-15, 2003, pp. 208-226, Seattle, Washington.

Crabtree, A., and Rodden, T., "Domestic Routines and Design for The Home," Computer Supported Cooperative Work: The Journal of Collaborative Computing, Kluwer Academic Publishers, 2004, 40 pages, vol. 13 (2).

Hemmings, T., Crabtree, A., Rodden, T., Clarke, K., and Rouncefield, M., "Probing the Probes," Proceedings of the 7th Biennial Participatory Design Conference, Jun. 23-25, 2002, pp. 42-50, Malmö, Sweden.

Intille, S.S., Tapia, E.M., Rondoni, J., Beaudin, J., Kukla, C., Agarwal, S., Bao, L., and Larson, K., "Tools for Studying Behavior and Technology in Natural Settings," In the Proceedings of UbiComp 2003, pp. 157-174, vol. LNCS 2864, A.K. Dey, A. Schmidt, and J.F. McCarthy, Eds. Berlin Heidelberg: Springer.

Aipperspach, R., Rattenbury, T., Woodruff, A., and Canny, J., "A Quantitative Method for Revealing and Comparing Places in the Home," In the Proceedings of UbiComp 2006, Sep. 2006, pp. 1-18, Orange County,.

Aipperspach, R., Woodruff, A., Anderson, K., and Hooker, B., "Maps of Our Lives: Sensing People and Objects Together in the Home," EECS Department, University of California, Berkeley, Nov. 30, 2005, pp. 1-11.

Elliot, K., Neustaedter, C., and Greenberg, S., "Time, Ownership and Awareness: The Value of Contextual Locations In the Home," In the Proceedings of UbiComp (Proceedings of the 7th International Conference on Ubiquitous Computing, Tokyo, Japan), Sep. 11-14, 2005, p. 251-268.

O'Brien, J., Rodden, T., Rouncefield, M., and Hughes, J., "At Home with the Technology: An Ethnographic Study of a Set-Top-Box Trial," ACM Transactions on Computer-Human Interaction, Sep. 1999, pp. 282-308, vol. 6, No. 3.

Mainwaring, S.D., and Woodruff, A., "Investigating Mobility, Technology, and Space in Homes, Starting with 'Great Rooms '," In the Proceedings of EPIC 2005, Nov. 14-15, 2005, pp. 188-195.

Philipose, M., Fishkin, K.P., Perkowtiz, M., Patterson, D.J., Fox, D., Kautz, H., and Hähnel, D., "Inferring Activities from Interactions with Objects," IEEE Pervasive Computing, Oct.-Dec. 2004, pp. 10-17, vol. 3, Issue 4.

Patel, S.N., Troung, K.N., and Abowd, G.D., "PowerLine Positioning: A Practical Sub-Room-Level Indoor Location System for Domestic Use," In the Proceedings of UbiComp, pp. 441-458, Orange County, CA.

Patel, S.N., "Bringing Sensing to the Masses: An Exploration in Infrastructure-Mediated Sensing" (slides and transcript of presentation), Intel Labs, Apr. 28, 2008, 133 pages, Seattle, Washington.

Patel, S., Gupta, S., and Reynolds, M., "End-User-Deployable Whole House Contact-Less Power Consumption Sensing," UbiComp 2009, Sep. 30, 2009, 4 pages, Orlando, Florida.

Mountain, D., "Summary The Impact of Real-Time Feedback on Residential Electricity Consumption: The Hydro One Pilot," Mar. 2006, 4 pages.

Darby, S., "Making it Obvious: Designing Feedback into Energy Consumption," Proceedings of the Second International Conference on Energy Efficiency in Household Appliances and Lighting, 2000, 11 pages.

Froehlich, J.E., "Sensing and Feedback of Everyday Activities to Promote Environmentally Sustainable Behaviors," Thesis Proposal, Computer Science & Engineering, University of Washington, Jul. 23, 2009, 35 pages, Seattle, Washington.

Brandon, G. and Lewis, A., "Reducing Household Energy Consumption: A Qualitative and Quantitative Field Study," Journal of Environmental Psychology, Mar. 1999, pp. 75-85, Academic Press, vol. 19, No. 1.

Parker, D., Hoak, D., and Cummings, J., "Contract Report: Pilot Evaluation of Energy Savings from Residential Energy Demand Feedback Devices," Florida Solar Energy Center, A Research Institute of the University of Central Florida, Jan. 2008, 32 pages.

Ueno, T., Inada, R., Saeki, O., and Tsuji, K., "Effectiveness of Displaying Energy Consumption Data in Residential Houses—Analysis on How the Residents Respond," ECEEE 2005 Summer Study—What Works and Who Delivers?, May-Jun. 2005, pp. 1289-1299, France.

Arvola, A., Uutela, A., and Anttila, U., "Billing Feedback as Means to Encourage Household Electricity Conservation: A Field experiment in Helsinki," Proceedings of the 1993 Summer Study of the European Council for Energy Efficient Economy, Jun. 2-7, 2003, pp. 11-21, Saint-Raphaël, France.

Darby, S., "The Effectiveness of Feedback on Energy Consumption," Environmental Change Institute, University of Oxford, Apr. 2006, pp. 1-21.

Fischer, C., "Feedback on Household Electricity Consumption: A Tool for Saving Energy?," Energy Efficiency (2008), Mar. 28, 2008, pp. 79-104.

Froehlich, J., Everitt, K., Fogarty, J., Patel, S., and Landay, J., "Sensing Opportunities for Personalized Feedback Technology to Reduce Consumption," DUB Institute, Department of Computer Science and Engineering, University of Washington, CHI Sustainability Workshop, In the extended proceedings of CHI 2009, 7 pages.

Mountain, D.C., "Price Influences Demand," DeGroote School of Business, McMaster University, Jun. 5, 2008, 16 pages.

Horst, G.R., "Project Report: Energy Monitoring System," Whirlpool Corporation, Woodridge Energy Study & Monitoring Pilot, 2006, 99 pages.

Patel, S.N., Reynolds, M.S., and Abowd, G.D., "Detecting Human Movement by Differential Air Pressure Sensing in HVAC System Ductwork: An Exploration in Infrastructure Mediated Sensing," In the Proceedings of Pervasive 2008, May 19-22, 2008, pp. 1-18, Sydney, Australia.

Beckman, C., Consolvo, S., and LaMarca, A., "Some Assembly Required: Supporting End-User Sensor Installation in Domestic Ubiquitous Computing Environments," UbiComp 2004: Ubiquitous Computing: 6th International Conference, Sep. 7-10, 2004, pp. 107-124, Nottingham, UK.

Bian, X., Abowd, G.D., and Rehg, J.M., "Using Sound Source Localization to Monitor and Infer Activities in the Home," In the Proceedings of the Third International Conference on Pervasive Computing, May 8-13, 2005, 16 pages, Munich, Germany.

Patel, S.N., Robertson, T., Kientz, J.A., Reynolds, M.S., and Abowd, G.D., "At the Flick of a Switch: Detecting and Classifying Unique Electrical Events on the Residential Power Line," In the Proceedings of UbiComp 2007, Sep. 16, 2007, pp. 271-288, Innsbruck, Austria.

Hirsch, T., Forlizzi, J., Hyder, E., Goetz, J., Stroback, J., and Kurtz, C., "The ELDer Project: Social, Emotional, and Environmental Factors in the Design of Eldercare Technologies," Conference on Universal Usability 2000, Nov. 16-17, 2000, pp. 72-79, Arlington, Virginia.

Koile, K., Tollmar, K., Demirdjian, D., Shrobe, H., and Darrell, T., "Activity Zones for Context-Aware Computing," Proceedings of UbiComp 2003, Oct. 12-15, 2003, pp. 90-106.

Tapia, E., Intille, S., Lopez, L., and Larson, K., "The Design of a Portable Kit of Wireless Sensors for Naturalistic Data Collection," Proc. of Pervasive 2006, pp. 117-134.

Wilson, D., and Atkeson, C., "Simultaneous Tracking and Activity Recognition (STAR) Using Many Anonymous, Binary Sensors," In the Proceedings of Pervasive 2005, pp. 62-79.

Froehlich, et. al., "Hydro-Sense: Infrastructure-Mediated Single-Point Sensing of Whole-Home Water Activity," In Proc. of UbiComp 2009, Sep.-Oct. 2009, pp. 235-244, Florida.

Hart, G., "Advances in Nonintrusive Appliance Load Monitoring," Proc. of EPRI Information and Automation Conference, Jun. 1991, pp. 1870-1891.

Iachello, G., and Abowd, G., "Privacy and Proportionality: Adapting Legal Evaluation Techniques to Inform Design in Ubiquitous Computing," Proc. of Chi, 2005, pp. 91-100.

Mitchell, T., "Machine Learning," McGraw Hill, 1997.

Marubayashi, G., "Noise Measurements of the Residential Power Line," Proc. of Int'l. Symposium on Power Line Communications, 1997, pp. 104-108.

Rowan, J., and Mynatt, E.D., "Digital Family Portrait Field Trial: Support for Aging in Place," Proc. of ACM Conference (CHI 2005), Apr. 2005, pp. 521-530.

Paradiso, J.A., "Some Novel Applications for Wireless Inertial Sensors," Proc. of NSTI-Nanotech 2006, May 2006, pp. 431-434, Boston, MA.

Drenker, S., and Kader, A., "Nonintrusive Monitoring of Electrical Loads," IEEE Computer Applications in Power, Oct. 1999, pp. 47-51, vol. 12, No. 4.

Murata, H., and Onoda, T., "Estimation of Power Consumption for Household Electric Appliances," 9th Int'l Conf. on Neural Information Processing, Nov. 2002, 5 pages.

Prudenzi, A., "A Neuron Nets Based Procedure for Identifying Domestic Appliances Pattern-of-Use from Energy Recordings at Meter Panel," IEEE, 2002, pp. 941-945, vol. 2.

Laughman, C., Lee, K., Cox, R., Shaw, S., Leeb, S., Norford, L. and Armstrong, P., "Power Signature Analysis," Power and Energy Magazine, IEEE, Mar.-Apr. 2003, pp. 56-63.

Tapia, E., et al., "Activity Recognition in the Home Setting Using Simple and Ubiquitous Sensors," Pervasive Computing (Lecture Notes in Computer Science), 2004, pp. 158-175.

* cited by examiner

1 — Resistive load

2 — Inductive load from mechanical switching (ex. fan motor)

3 — Inductive load from solid state switching (ex. PC power supply)

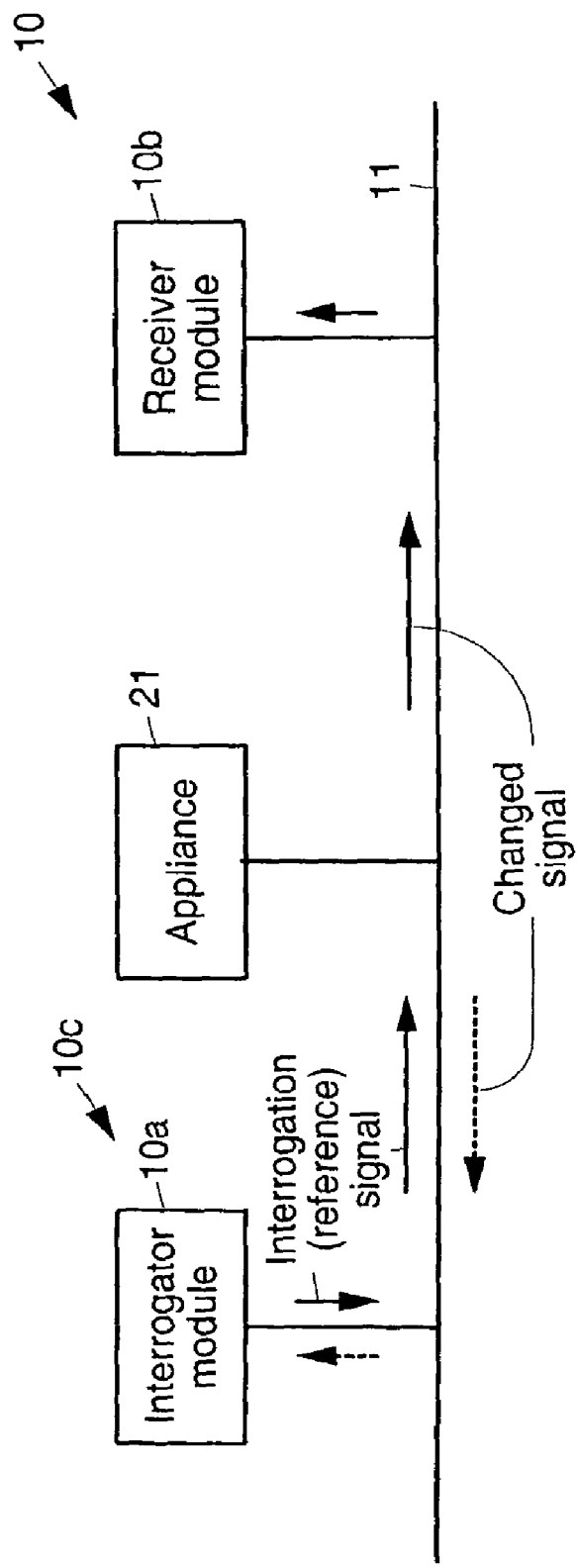

DETECTING ACTUATION OF ELECTRICAL DEVICES USING ELECTRICAL NOISE OVER A POWER LINE

BACKGROUND

The present invention relates to apparatus and methods for detecting electrical device actuation using electrical noise over a power line.

A common research interest in ubiquitous computing has been the development of inexpensive and easy-to-deploy sensing systems that support activity detection and context-aware applications in the home. For example, several researchers have explored using arrays of low-cost sensors, such as motion detectors or simple contact switches. Such sensors are discussed by Tapia, E. M., et al. "Activity recognition in the home setting using simple and ubiquitous sensors," Proc of PERVASIVE 2004, pp. 158-175, Tapia, am., et al. "The design of a portable kit of wireless sensors for naturalistic data collection," Proc of Pervasive 2006, pp. 117-134, and Wilson, D. H., et al. "Simultaneous Tracking and Activity Recognition (STAR) Using Many Anonymous, Binary Sensors," Proc of Pervasive 2005, pp. 62-79, 2005, for example.

Although these solutions are cost-effective on an individual sensor basis, they are not without some drawbacks. For example, having to install and maintain many sensors may be a time-consuming task, and the appearance of many sensors may detract from the aesthetics of the home. This is discussed by Beckmann, C., et al. "Some Assembly Required: Supporting End-User Sensor Installation in Domestic Ubiquitous Computing Environments," Proc of Ubicomp 2004. pp. 107-124. 2004, and Hirsch, T., et al. "The ELDer Project: Social, Emotional, and Environmental Factors in the Design of Eldercare Technologies," Proc of the ACM Conference on Universal Usability, pp. 72-79, 2000, for example.

In addition, the large number of sensors required for coverage of an entire home may increase the number of potential failure points. To address these concerns, recent work has focused on sensing through existing infrastructure in a home. For example, researchers have looked at monitoring the plumbing infrastructure in the home to infer basic activities or using the residential power line to provide indoor localization. See, for example, Fogarty, J., et al. "Sensing from the Basement: A Feasibility Study of Unobtrusive and Low-Cost Home Activity Recognition," Proc of ACM Symposium on User Interface Software and Technology (UIST 2006) 2006, and Patel, S. N., et al. "PowerLine Positioning: A Practical Sub-Room-Level Indoor Location System for Domestic Use," Proceedings of Ubicomp 2006.

Research relating to activity and behavior recognition in a home setting may be classified by examining the origin of the sensing infrastructure disclosed herein. The first area of classification includes approaches that introduce new, independent sensors into the home that directly sense various activities of its residents. This classification includes infrastructures where a new set of sensors and an associated sensor network (wired or wireless) is deployed. A second area encompasses those approaches that take advantage of existing home infrastructure, such as the plumbing or electrical busses in a home, to sense various activities of residents. The goal of the second approach is to lower the adoption barrier by reducing the cost and/or complexity of deploying or maintaining the sensing infrastructure.

Some research approaches use high-fidelity sensing to determine activity, such as vision or audio systems that capture movement of people in spaces. See, for example, Bian, X., et al. "Using Sound Source Localization in a Home Environment," Proc of the International Conference on Pervasive Computing, 2005, and Koile, K., et al. "Activity Zones for Context-Aware Computing," Proc of UbiComp 2003: Ubiquitous Computing, 2003, Seattle, Wash., USA. Chen et al. in "Bathroom Activity Monitoring Based on Sound," Proc of Pervasive 2005, pp. 47-61, 2005, installed microphones in a bathroom to sense activities such as showering, toileting, and hand washing. While these approaches may provide rich details about a wide variety of activities, they are often very arduous to install and maintain across an entire household.

Use of these high fidelity sensors in certain spaces raise concerns about the balance between value-added services and acceptable surveillance, particularly in home settings. This is discussed by Beckmann, C., et al. "Some Assembly Required: Supporting End-User Sensor Installation in Domestic Ubiquitous Computing Environments," Proc of Ubicomp 2004, pp. 107-124. 2004, Hirsch, T., et al. "The ELDer Project: Social, Emotional, and Environmental Factors in the Design of Eldercare Technologies," Proc of the ACM Conference on Universal Usability, pp. 72-79.2000, and Iachello, G., et al. "Privacy and Proportionality: Adapting Legal Evaluation Techniques to Inform Design In Ubiquitous Computing," Proc of CHI 2005, pp. 91-100, 2005.

Another class of approaches explores the use of a large collection of simple, low-cost sensors, such as motion detectors, pressure mats, break beam sensors, and contact switches, to determine activity and movement. See Tapia, E. M., et al. "Activity recognition in the home setting using simple and ubiquitous sensors," Proc of PERVASIVE 2004, pp. 158-175, 2006, Tapia, E. M., et al. "The design of a portable kit of wireless sensors for naturalistic data collection," Proc of Pervasive 2006, pp. 117-134, and Wilson, D. H., et al. "Simultaneous Tracking and Activity Recognition (STAR) Using Many Anonymous, Binary Sensors," Proc of Pervasive 2005, pp. 62-79, 2005. The Tapia et al. papers discuss home activity recognition using many state change sensors, which were primarily contact switches. These sensors were affixed to surfaces in the home and logged specific events for some period of time. The advantage of this approach is being able to sense physical activities in a large number of places without the privacy concerns often raised for high-fidelity sensing (e.g., bathroom activity). There are also some disadvantages to this add-on sensor approach, which include the requirements of powering the sensors, providing local storage of logged events on the sensor itself, or a wireless communication backbone for real-time applications. These requirements all complicate the design and maintenance of the sensors, and the effort to install many sensors and the potential impact on aesthetics in the living space may also negatively impact mass adoption of this solution.

As an example of the often difficult balance of the value of in home sensing and the complexity of the sensing infrastructure, the Digital Family Portrait is a peace of mind application for communicating well-being information from an elderly person's home to a remote caregiver. See, for example, Rowan, J. et al. "Digital Family Portrait Field Trial: Support for Aging in Place," Proc of the ACM Conference on Human Factors in Computing Systems (CHI 2005), pp. 521-530, 2005. In this deployment study, movement data was gathered from a collection of strain sensors attached to the underside of the first floor of a home. Installation of these sensors was difficult, time-consuming, and required access under the floor. Although the value of the application was proven, complexity of the sensing limited the number of homes in which the system could be easily deployed.

Other approaches, which are similar to ours, are those that use existing home infrastructure to detect events. Fogarty et al. "Sensing from the Basement: A Feasibility Study of Unobtrusive and Low-Cost Home Activity Recognition," Proc of ACM Symposium on User Interface Software and Technology (UIST 2006), 2006, explored attaching simple microphones to a home's plumbing system, thereby leveraging an available home infrastructure. The appeal of this solution is that it is low-cost, consists of only a few sensors, and is sufficient for applications, such as the Digital Family Portrait, for which the monitoring of water usage is a good proxy for activity in the house. This approach requires relatively long timescales over which events must be detected, sometimes up to ten seconds. This longer time increases the likelihood of overlapping events, which are harder to distinguish.

In contrast, power line event detection operates over timescales of approximately half a second and thus overlapping is less likely. Some water heaters constantly pump hot water through the house, complicating the detection of some on-demand activities. Detecting noise on water pipes introduced by other household infrastructure requires careful placement of the microphone sensors. Some homes may not have plumbing infrastructure that is easily accessible, particularly those with a finished basement or no basement at all. Despite these limitations, this solution is very complementary to our approach, as some events revealed by water usage, such as turning on a faucet in a sink or flushing a toilet, do not have direct electrical events that could serve as predictive antecedents. The converse also holds, as a light being turned on often does not correlate with any water-based activity.

Another "piggybacking" approach is to reuse sensing infrastructure or devices in the home that may be present for other purposes. For example, ADT Security System's QuietCare offers a peace of mind service that gathers activity data from the security system's motion detectors. This is discussed on the ADT QuietCare website at http://www.adt.com/quietcare/.

There are other techniques that employ electrical power use to sense activity. For example, some researchers have monitored electrical current flow to infer the appliances or electrical equipment being used in the house as a proxy for detecting activity. See, for example, Paradiso, J. A. "Some Novel Applications for Wireless Inertial Sensors," Proc of NSTI Nanotech 2006, Vol. 3; Boston, Mass., May 7-11, 2006, pp. 431-434, and Tapia, E. M., et al. "The design of a portable kit of wireless sensors for naturalistic data collection," Proc of Pervasive 2006, pp. 117-134.

The Paradiso platform monitors current consumption of various appliances of interest. Changes in current flow indicate some change in state for the instrumented appliance, such as a change from on to off. This solution requires a current sensor to be installed inline with each appliance or around its power cord and thus only works well if it is sufficient to study the usage of a small subset of appliances and those appliances' power feeds are easy accessible. An extension to the Paradiso work is to install current sensors on major branch circuits of the power lines, but this may require professional installation to provide an acceptable level of safety. However, it would be desirable to detect a larger number of appliances with less instrumentation and with a much easier deployment phase.

There is therefore a need for apparatus and methods for detecting electrical device actuation using electrical noise over a power line.

BRIEF DESCRIPTION OF THE DRAWINGS

The features and advantages of the present invention may be more readily understood with reference to the following detailed description taken in conjunction with the accompanying drawings, wherein like reference numerals designate like structural elements, and in which:

FIG. 7 illustrates an active embodiment of the exemplary electrical device actuation detection apparatus.

DETAILED DESCRIPTION

Figure 1:
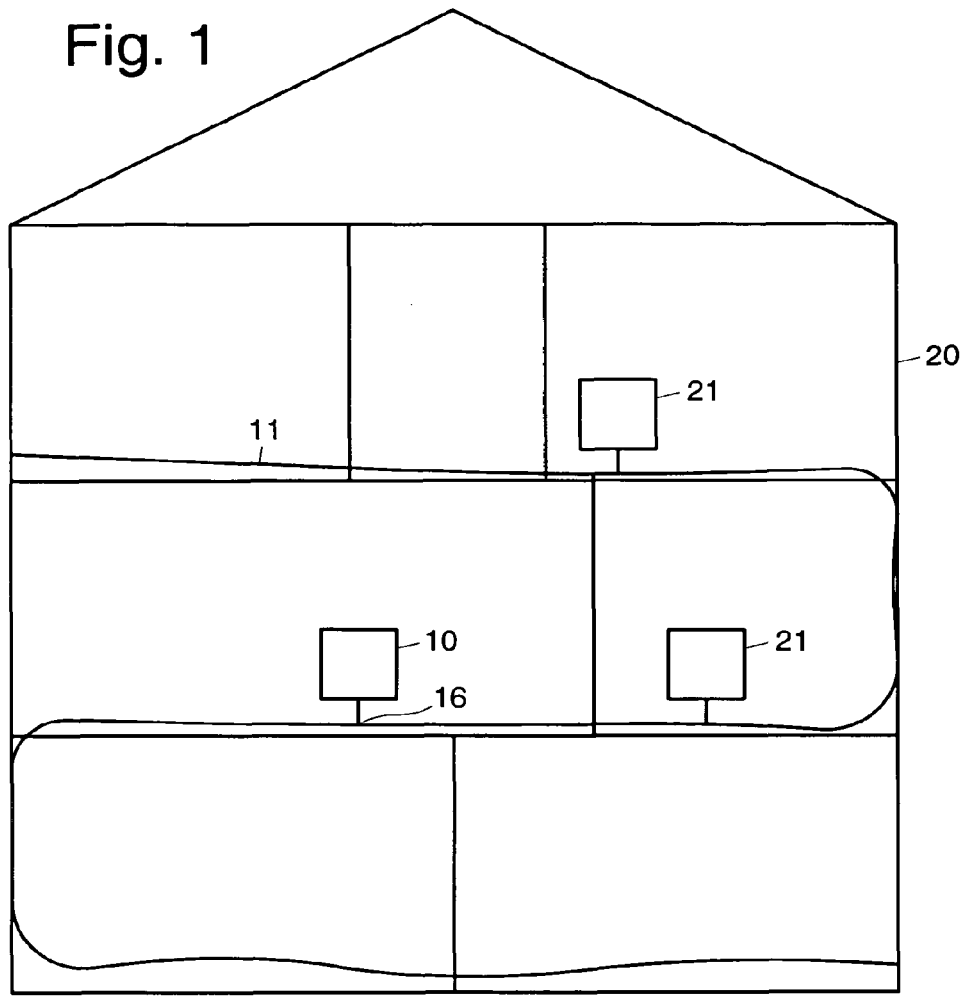
FIG. 1 illustrates exemplary electrical device actuation detection apparatus installed in a structure, such as a residence.

In order to leverage existing infrastructure to support activity detection, discussed below is an approach that uses a home's electrical system as an information source to observe various electrical events. Detection and classification of these events may be used in a variety of applications, such as healthcare, entertainment, home automation, energy monitoring, and post-occupancy research studies. The approach described herein improves upon previous work of the present inventors relating to power line positioning systems, such as is discussed by Patel, S. N., et al., "PowerLine Positioning: A Practical Sub-Room-Level Indoor Location System for Domestic Use," Proceedings of Ubicomp 2006, and described in U.S. provisional application Ser. No. 60/817, 225, filed Jun. 28, 2006, and U.S. patent application Ser. No. 11/824,204, filed Jun. 8, 2007. The disclosed approach uses existing power line infrastructure to provide practical localization within a home. The techniques disclosed herein passively sense simple electrical events, whereas the previous work senses the location of actively tagged objects.

An advantage of the approach is that it requires installation of only a single, plug-in module (plugged into the existing power line infrastructure) that connects to an embedded or personal computer. The computer records and analyzes electrical noise on the power line caused by switching of significant electrical loads. Machine learning techniques applied to these patterns identify when unique events occur. Examples include human-initiated events, such as turning on or off a specific light switch or plugging in a CD player, as well as automatic events, such as a compressor or fan of an HVAC system turning on or off under control of a thermostat.

By observing actuation of certain electrical devices, the location and activity of people in the space can be inferred and used for applications that rely on this contextual information. For example, detecting that a light switch was turned on can be an indication that someone entered a room, and thus an application could adjust the thermostat to make that room more comfortable. Other human-initiated kitchen events can also be detected, such as a light turning on inside a refrigerator or microwave when its door is opened. These events may indicate meal preparation.

The disclosed approach also has implications for providing a low-cost solution for monitoring energy usage. An application can log when particular electrical loads are active, revealing how and when electrical energy is consumed in the household, leading to suggestions on how to maintain a more energy-efficient household. In addition, because the disclosed approach is capable of differentiating between the on and off events of a particular device in real time, those events can be "linked" to other actuators for a variety of home automation scenarios. The disclosed approach can thus provide for a home automation system that maps actuation of a stereo system to an existing light switch without having to install additional wiring.

Discussed below is the underlying theory and initial implementation details of the disclosed approach to power line event detection. Results of a series of tests are discussed that illustrate the stability of the disclosed approach over time and its ability to sense electrical events in different homes. These tests involve installing a device in a single location of a house and collecting data on a variety of electrical events within that house. Results show that a support vector machine system can learn and later classify various unique electrical events with accuracies ranging from 85-90%.

Referring to the drawing figures, FIG. 1 illustrates exemplary electrical device actuation detection apparatus 10 installed in a residence 20, for example. The residence 20 has an electrical power line 11 (electrical system wiring 11 or power line infrastructure 11) that is monitored to identify electrical events that occur throughout the home 20. It is to be understood that the electrical device actuation detection apparatus 10 and methods 40 may be used in any structure 20, including homes 20 and businesses 20, for example.

Figure 1A:
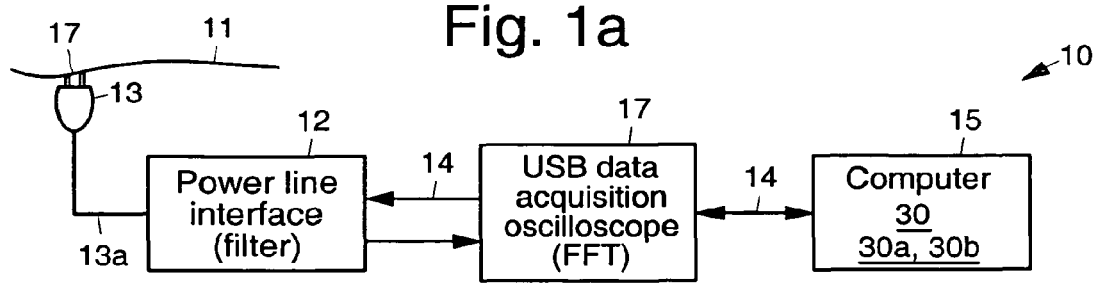
FIG. 1a illustrates prototype electrical device actuation detection apparatus.

FIG. 1a illustrates an exemplary reduced-to-practice electrical device actuation detection apparatus 10 used for testing purposes. The exemplary electrical device actuation detection apparatus 10 comprises a single power line interface module 12, that is plugged via an electrical cord 13a and plug 13 into an electrical outlet 17 of the existing power line infrastructure 11 of the home 20. Although not necessarily required, the module 11 may be installed in a convenient, central location in the home 20. The module 12 is connected via a USB interface 14, for example, to a computer 15 that includes a software application 30 that collects and performs analysis on incoming (detected) electrical noise present in the power line infrastructure 11. Although not required for normal operation of the electrical device actuation detection apparatus 10, a USB data acquisition oscilloscope 17 is used in the apparatus 10 to extract a fast Fourier transform (FFT). In operational apparatus 10, the USB data acquisition oscilloscope 17 is replaced by a fast Fourier transform (FFT) circuit, which is preferably embedded in the power line interface module 12. The software application 30 is configured to process the FFT data and learn certain characteristics relating to electrical noise produced by switching electrical devices 21 (FIG. 1) on or off and is able to predict when those devices 21 are actuated based on the learned phenomena.

The electrical device actuation detection apparatus 10 was developed for countries that use 60 Hz electrical systems. However, it is to be understood that it can easily be extended to frequencies used in other countries, such as those that use 50 Hz power, for example.

Figure 1B:
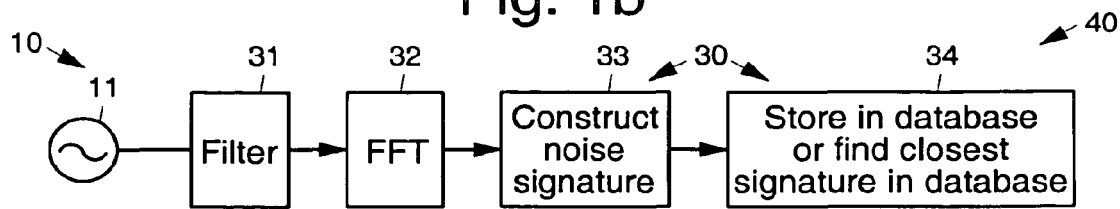
FIG. 1b illustrates the architecture of an exemplary electrical device actuation detection apparatus along with exemplary processing methods.

FIG. 1b illustrates an exemplary architecture of the electrical device actuation detection apparatus 10 and exemplary processing methods 40. The exemplary architecture of the electrical device actuation detection apparatus 10 and the method 40 processes noise present in the power line infrastructure 11 resulting from, and associated with, actuation of electrical devices 21. The electrical output of the power line infrastructure 11 is filtered 31 using the power line interface module 12. The filtered electrical output of the power line infrastructure 11 is fast Fourier transformed 32 to produce voltage versus frequency versus time data associated with noise produced when an electrical device 21 coupled to the power line infrastructure 11 is toggled (switched) on or off. The fast Fourier transformed noise data is then processed 33 (in the computer 15, for example) to construct a noise signature associated with the toggling event. The noise signature corresponding to the toggling event (toggled electrical switch 21 or load 21) is processed 34 to store it in a database to calibrate the apparatus 10, or find a stored signature in the database that is closest to it to identify which electrical switch 21 or load 21 has been toggled. The data comprising the noise signature may be remotely transferred to a central database where it may be processed to provide power consumption analysis.

Theory of Operation

The disclosed approach relies on the fact that abruptly switched (mechanical or solid-state) electrical loads produce broadband electrical noise either in the form of a transient or continuous noise. This electrical noise is generated between hot and neutral (known as normal mode noise), or between neutral and ground (known as common mode noise). Transient and continuous noise on the residential power line 12 is typically high in energy and may often be observed with a nearby AM radio. The types of electrical noise that are of interest are produced within the home 20 and are created by the fast switching of relatively high currents. For example, a motor-type load, such as a fan, creates a transient noise pulse when it is first turned on and then produces a continuous noise signal until it is turned off.

In addition, the mechanical switching characteristics of a light switch generates transient electrical noise. This is discussed by Howell, E. K., "How Switches Produce Electrical Noise," IEEE Transactions on Electromagnetic Compatibility, Volume 21:3, pp. 162-170, August 1979. Other examples of noisy events include using a garage door opener, plugging in a power adaptor for an electric device, or turning on a television. Marubayashi provides a more complete description of this electrical noise phenomenon in "Noise Measurements of the Residential Power Line," Proceedings of International Symposium on Power Line Communications and Its Applications 1997, pp 104-108.

Figure 2A:
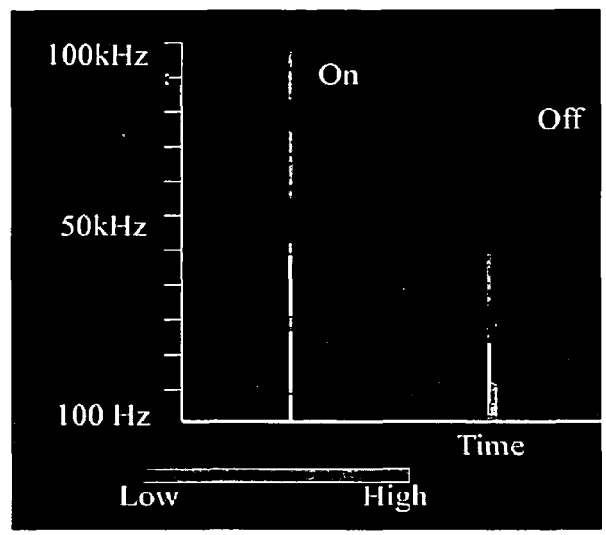
FIG. 2a-2c show sample frequency domain graphs of a light switch that is toggled at different times.
Figure 2B:
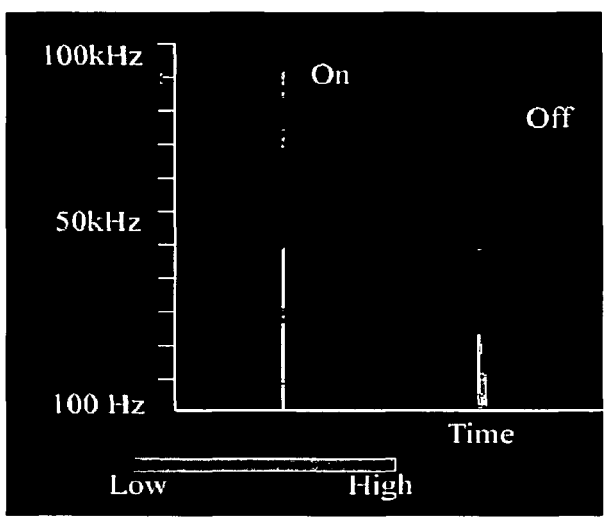
Figure 2C:
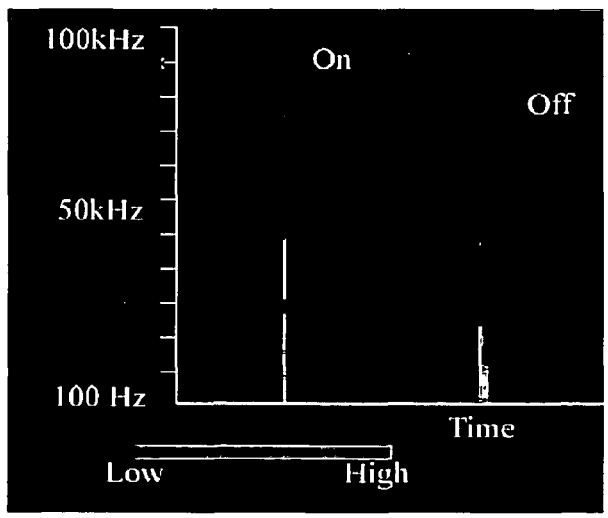
Figure 2D:
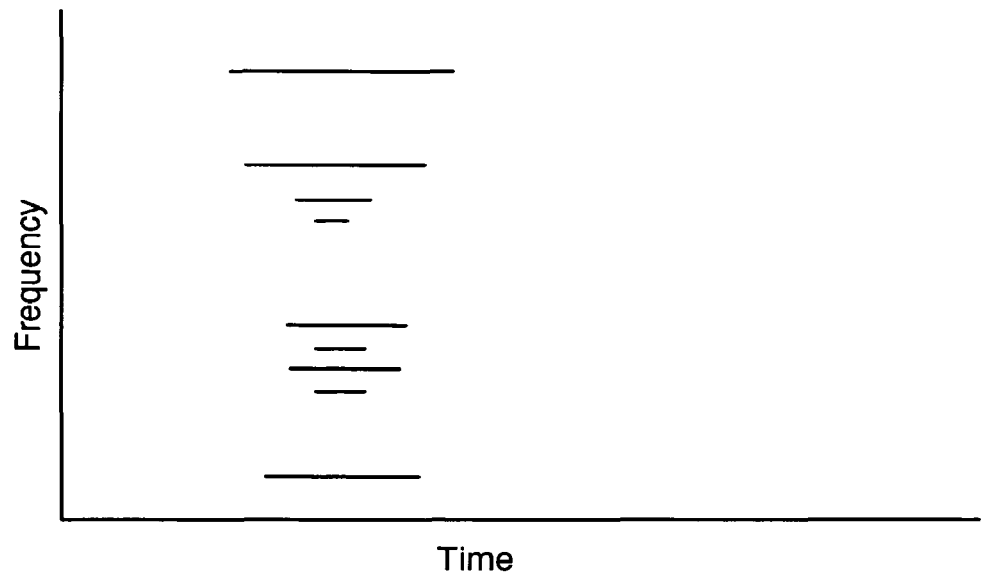
FIGS. 2d and 2e illustrate graphs of frequency versus time and voltage versus frequency associated with an exemplary light switch.
Figure 2E:
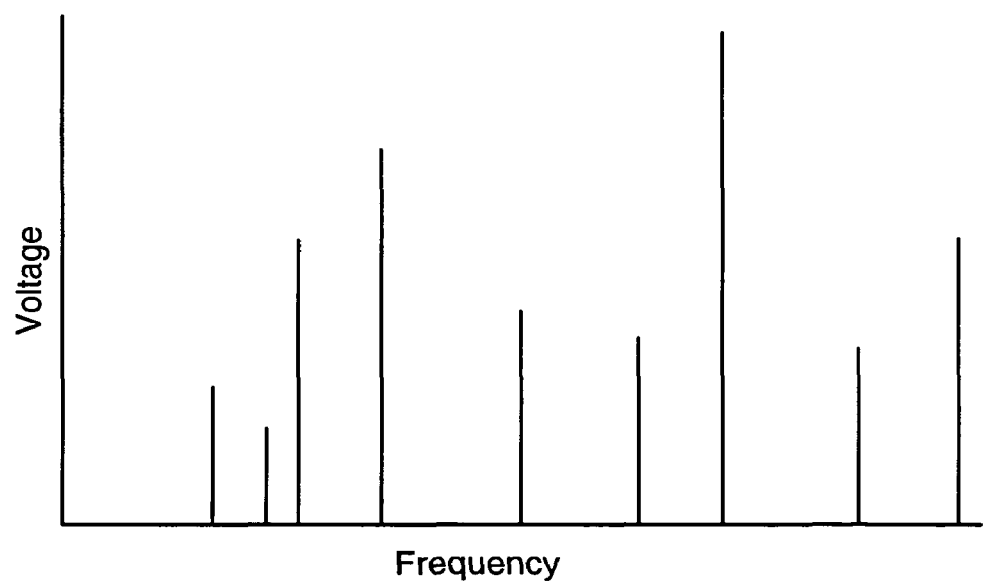

In the case of transient noise, impulses typically last only a few microseconds and include a rich spectrum of frequency components, that can range from 10 Hz to 100 kHz. Thus, it is desirable to consider both the temporal nature (duration) of the transient noise and its frequency components. Depending on the switching mechanism, the load characteristics, and length of transmission line, these impulses can be very different. For example, FIG. 2a shows a sample frequency domain graph of a light switch 21 that is toggled in a home 20 (light on followed by light off). The graphs indicate amplitudes at each frequency level. Each sample is rich in a broad range of frequencies. On and off events are each different enough to be distinguished. In addition, the individual on and off events are similar enough over time to be recognized later. Notice the rich number of high amplitude frequency components for each pulse and their relative strengths. Also, notice that the signature of a device 21 that is turned on is different from the same device when it is turned off. FIG. 2b shows the same switch 21 actuated in the same order as FIG. 2a, but taken 2 hours later, and FIG. 2c shows it taken one week later.

The amplitudes of individual frequency components and the duration of the impulse produced by each switch 21 are similar between the three graphs, although there are a few high frequency regions that are different across the samples. Even similar light switches 21 produce different signatures, which is likely due to the mechanical construction of each switch 21 and the influence of the power line length connected to each switch 21. For example, it was observed that different three-way wall switches 21 connected to the same light each produced discernable signatures. The main difference was in the relative amplitudes of the frequencies that are observed. Devices 21 that produce continuous noise are bounded by transient phenomena, but also exhibit electrical noise during their powered operation. For this class of noise, it is possible to not only identify it based on its transient response but also its continuous noise signature.

Figure 3:
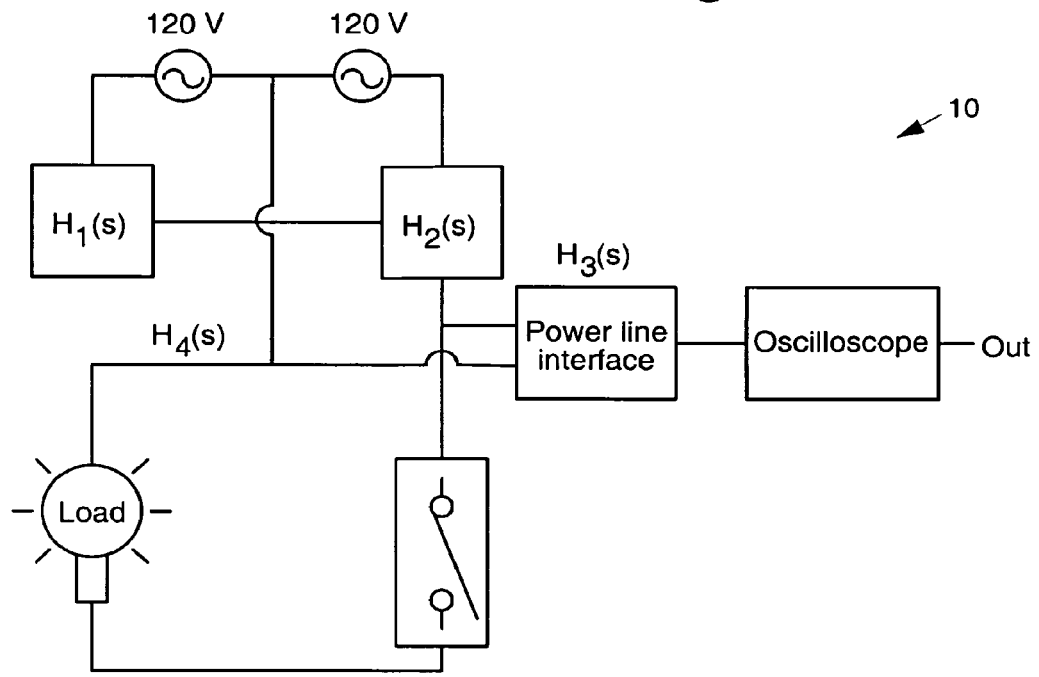
FIG. 3 shows a high-level overview of a simplified model of a home's electrical infrastructure and where particular noise transfer functions occur.
Figure 3:
Figure 3:
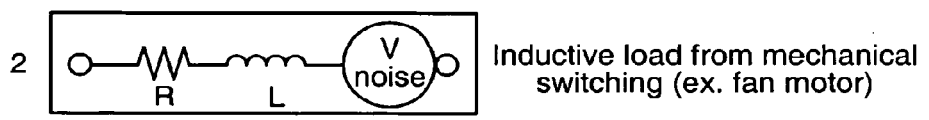
Figure 3:
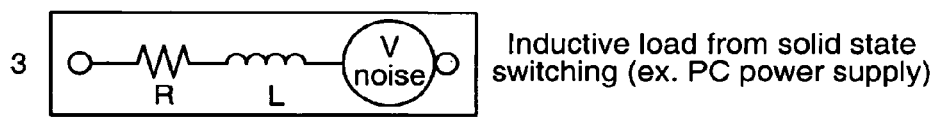

It is assumed that the noise signature of a particular device 21 depends both on the device 21 and the transmission line behavior of the interconnecting power line 11, so both contributions have been captured in a single model. FIG. 3 depicts a high-level overview of a simplified model of a home's electrical infrastructure 11 and where particular noise transfer functions occur, denoted as H(s). The bottom portion of FIG. 3 shows three general types of loads found in a home 20, a purely resistive load, an inductive load where voltage noise is generated from a continuous mechanical switching (motors), and an inductive load where voltage noise is generated by an internal oscillator of a solid state switch. The transfer functions reflect the fact that both the electrical transmission line 11 and the data collection module 12 connected to that line 11 contribute to some transformation of the noise from the source 21 to the collection module 12. The observed noise results from the imposition of all the transfer functions against the generated noise. The influence of the transfer function of the transmission line 11 is an important contributor to the different electrical noise signatures that were observed, which indicates why similar device types (e.g., light switches 21) can be distinguished and why the location of the data collection module 12 in the home 20 impacts the observed noise.

In the simplified model, three general classes of electrical noise sources 21 may be found in a home 20, which include resistive loads, inductive loads such as motors, and toads with solid state switching. Purely resistive loads, such as a lamp or an electric stove, do not create detectable amounts of electrical noise while in operation, although as a resistor, they produce trace amounts of thermal noise (Johnson noise) at a generally undetectable level. In this particular case, only transient noise is produced by minute arcing in the mechanical switch 21 itself (wall switch 21) when the switch 21 is turned on or off. A motor 21, such as in a fan or a blender, is modeled as both a resistive and inductive load. The continuous breaking and connecting by the motor brushes creates a voltage noise synchronous to the AC power of 60 Hz (and at 120 Hz). Solid state switching devices 21, such as MOSFETs found in computer power supplies or TRIACs in dimmer switches 21 or microwave ovens 21, emit noise that is different between devices 21 and is synchronous to an internal oscillator. Thus, the latter two classes contribute noise from both the external power switching mechanism (transient) and the noise generated by the internal switching mechanism (continuous).

In the United States, the Federal Communications Commission (FCC) sets guidelines on how much electrical noise AC-powered electronic devices can conduct back onto the power line 11 (Part 15 section of the FCC regulations). Device-generated noise at frequencies between 150 kHz-30 MHz cannot exceed certain limits. Regulatory agencies in other countries set similar guidelines on electronic devices. Although this mainly applies to electronic devices, such as those that have solid state switching power supplies, this gives us some assurance about the type and amount of noise we might expect on the power line 11.

It is often extremely difficult to analytically predict the transient noise from the general description of a load and its switching mechanism, because ordinary switches are usually not well characterized during their make-and-break times. However, it is possible to take a mapping approach by learning these observed signatures using supervised machine learning techniques. The challenge then becomes finding the important features of these transient pulses and determining how to detect the relevant ones of interest.

Hardware Details

Figure 4:
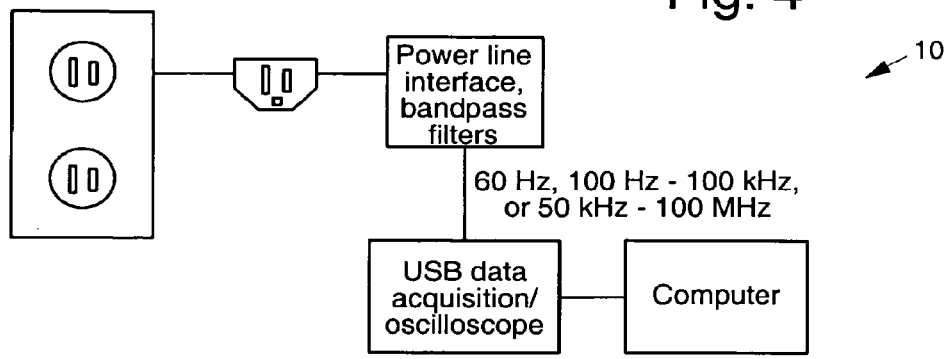
FIG. 4 shows a block diagram of an exemplary power line interface device.
Figure 6:
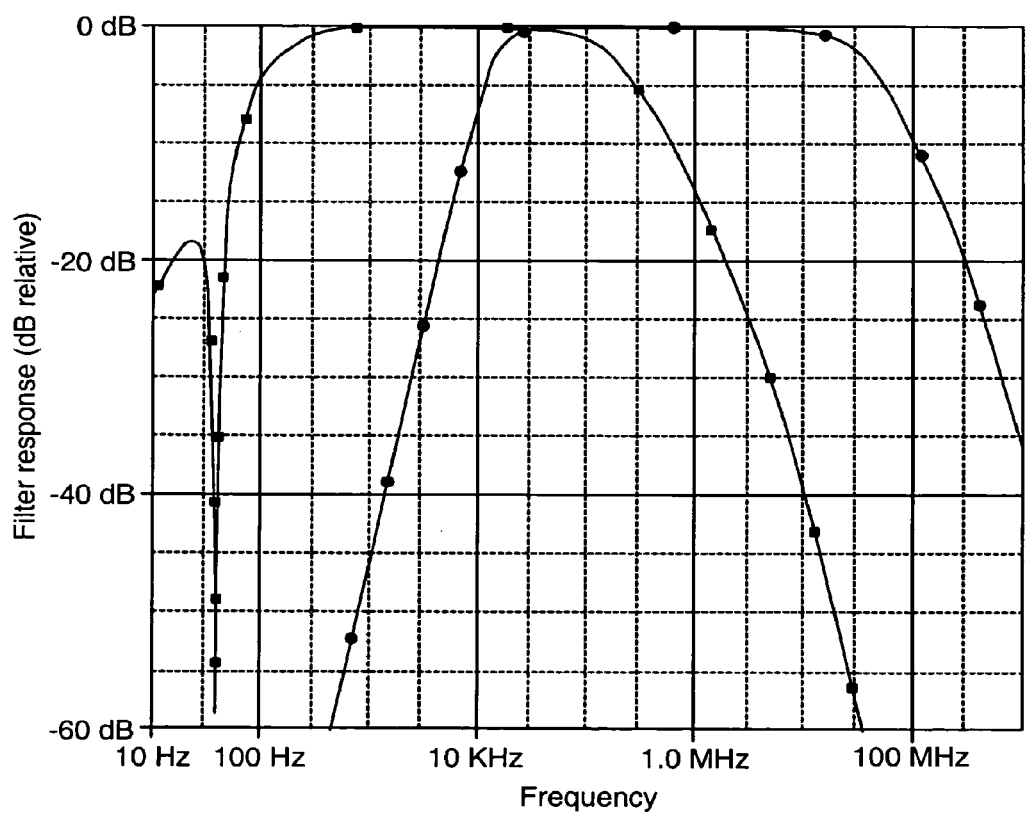
FIG. 6 shows a model of a frequency response curve of the power line data collection module for exemplary 100 Hz-100 kHz and 50 kHz-100 MHz outputs.
Figure 5:
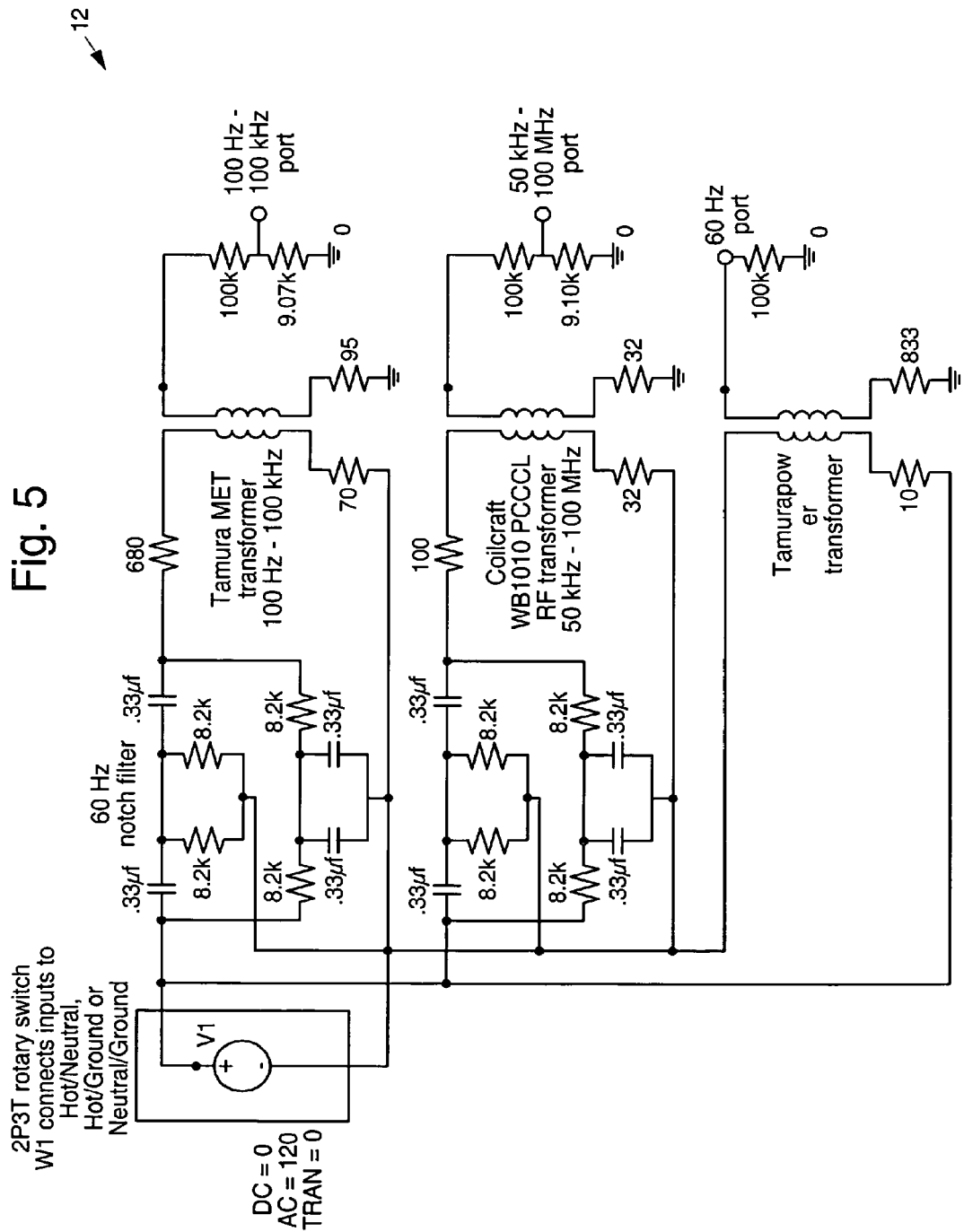
FIG. 5 shows a detailed schematic of an exemplary power line interface device.

To better understand the concept of detecting and learning various electrical events in the home 20, a prototype apparatus 10 was built that comprises a power line interface module 12 (data collection module 12) having three outputs, as illustrated in FIGS. 4 and 5. One output was a standard 60 Hz AC power signal, which was used during an initial testing and exploratory phase. The second output was an attenuated power line output that was bandpass-filtered with a passband of 100 Hz to 100 kHz. The third output was similarly attenuated and was bandpass-filtered with a 50 kHz to 100 MHz passband. These different filtered outputs were chosen to have the flexibility to experiment with different frequency ranges (FIG. 6). Note that the passbands are not limited to those illustrated and discussed herein, and any suitable passbands may be used. FIG. 6 shows a model of the frequency response curve of our power line data collection apparatus at the 100 Hz-100 kHz and the 50 kHz-100 MHz outputs. The 60 Hz dip is from the notch filter.

Both filtered outputs shown in FIG. 6 have a 60 Hz notch filter in front of their bandpass filters to remove the AC power frequency and enhance the dynamic range of the sampled data. The interface module 12 was built so that we could monitor the power line 11 between hot and neutral, neutral and ground, or hot and ground. The noise between hot and neutral (normal mode) was observed because many loads that are desirable to observe (such as table lamps and small appliances) do not have a ground connection.

The interface module 12 was connected to one 120V leg or branch of the electrical system. Most residential homes 20 and apartments in North America and many parts of Asia have a single-phase or a split single-phase electrical system. This means there are two 120V electrical branches coming into the home 20 to supply 240V appliances, but the two branches are in phase. It was found that the noise generated by devices of interest connected to the other electrical branch were already coupled to the electrical branch that was interfaced to, and so were detectable by our system. While this approach was practical and sufficient for a prototype investigation, a coupler may be plugged into a 240V outlet to ensure direct access to both electrical branches.

Finally, outputs of the power line interface module 12 were connected to a dual-input USB oscilloscope interface 17 (EBest 2000) that has built-in gain control. Each input has 10-bit resolution with a full scale voltage of 1V, so the least significant bit represents a voltage of 4 mV. The oscilloscope interface 17 had a real-time sampling rate of 100 million samples/sec. A C++ API is provided, resulting in a simple software interface to the sampled signal.

Software Details

The software application 30 used in the prototype apparatus 10 included a C++ application 30a that was written to sample the USB oscilloscope interface 17 and perform a fast Fourier transform (FFT) on the incoming signal to separate the component frequencies for analysis. The application 30a produces a waterfall plot, a commonly used frequency domain visualization in real-time used for visual inspection (such as is shown in FIG. 2). The application 30a performs this analysis almost in real-time, and it has the ability to record the data stream for post processing. A second application 30b, written in Java, performs machine learning and provides a user interface for the apparatus 10. The Java application 30b connects via a TCP connection to the FFT application 30a and reads the data values. The Java application 30b provides the user interface for surveying the home 20 and remotely accessing the data from the power line interface module 12. A Weka toolkit was used as the machine learning implementation. The Weka toolkit is discussed on the Weka website in an article entitled "Weka 3: Data Mining Software in Java," at http://www.cs.waikato.ac.nz/ml/weka/.

Electrical Events that can be Recognized

Testing was performed to identify electrical devices that could be detected with the apparatus 10 and see which electrical devices 21 would produce recognizable signatures that can be processed by the machine learning software 30b. The apparatus 10 was installed in a single fixed location during the data collection process. Data was collected with low frequency (100 Hz-100 KHz) and high frequency (50 kHz-100 MHz) ports. No major electrical devices 21 were activated (such as a HVAC, refrigerator, water pumps, etc.) by turning them off for the duration of the testing so it was known which devices 21 were causing which response. For each electrical device 21, noise signatures were visually observed and collected while turning a device 21 on, turning it off, and its stable-on state. Table 1 shows the various devices 21 that were tested detected and the events that were observed for each device 21 (on, off, continuously on state). Although many more devices, could have been observed we only a representative sample of commonly used devices are shown. Table 1 lists electrical devices 21 that were tested and events that were detectable. These devices 21 also consistently produced detectable event signatures.

After initial experimentation, it was found that most loads drawing less than 0.25 amps were practically undetectable loads relative to prominent electrical noise (transient and/or continuous). This is relates to the dynamic range of the data collection module 12; a collection module 12 with more than 10 bits of resolution would be able to detect lower current devices. The devices 21 listed in Table 1 exhibited strong and consistently reproducible signatures. However, a limitation was observed relating to how quickly a given device 21 could be switched (i.e., delay between toggles). Depending on the device 21, it was observed that approximately 500 ms delay between subsequent toggles was required for the data collection module 12 to detect a noise impulse successfully. This is largely attributed to the sampling and processing latency from the device 21 (e.g., USB latency plus processing delays on the computer 15).

While most devices 21 produce a transient pulse only a few microseconds in duration in their energized state, certain devices 21 continuously produce electrical noise while they are powered, as expected. For example, lamp dimmers or wall-mounted dimmer switches produce noise that was very rich in harmonics while they were activated. Similarly, microwave ovens couple broadband noise back on the power line during its use. These devices 21 tended to produce strong continuous noise above 5 kHz and reaching up to 1 MHz. It was also found that switching power supplies, such as those used in a laptop or personal computer, produce considerably higher noise in the 100 kHz-1 MHz range than at the lower 100 Hz-5 kHz range.

To understand devices 21 that produce continuous noise, various switching power supplies were tested in isolation from other electrical line noise. Using the higher 50 kHz-100 MHz output on the data collection module 12, it was found that many of these devices 21 produced more detectable continuous noise at the higher frequencies. At the lower 100 Hz-5 kHz range, fairly low amplitude, continuous noise, and a higher transient noise effect (from the flipping of the switch) was observed.

In the 100 Hz-100 kHz range, motor-based devices 21, suck as a ceiling or bathroom exhaust fan, exhibited slightly longer duration transient pluses when activated with a switch, but did not show continuous normal mode noise which would have been expected from repeated electromechanical switch-

TABLE 1

| Device class/type | Devices observed | On to Off transition noise? | Off to On transition noise? | Continuously on noise? |
|---|---|---|---|---|
| Resistive | Incandescent lights via wall switch | Y | Y | N |
| | Microwave door light | Y | Y | N |
| | Oven light/door | Y | Y | N |
| | Electric stove | Y | Y | N |
| | Refrigerator door | Y | Y | N |
| | Electric oven | Y | Y | N |
| Inductive (Mechanically Switched) | Bathroom exhaust fan | Y | Y | N |
| | Ceiling fan | Y | Y | N |
| | Garage door opener | Y | Y | N |
| | Dryer | Y | Y | N |
| | Dishwasher | Y | Y | N |
| | Refrigerator compressor | Y | Y | N |
| | HVAC/Heat pump | Y | Y | N |
| | Garbage disposal | Y | Y | N |
| Inductive (Solid State Switched) | Lights via a dimmer wall switch | Y | Y | Y |
| | Fluorescent lights via wall switch | Y | Y | N |
| | Laptop power adapter | Y | N | N |
| | Microwave oven | Y | Y | Y |
| | Television (CRT, plasma, LCD) | Y | Y | N | ing from motor brushes. This difference was attributed to the 60 Hz notch filter, which blocked the 60 Hz power frequency. To confirm this, an experiment was conducted in which various mechanically-switched devices (e.g., fans) were isolated and their noise output was observed. In the case of the fan, the data collection module 12 showed the transient pulse, but not the continuous electrical noise.

From these observations, the noise characteristics produced by different devices was characterized. It was observed that transient noise produced from a single abrupt switching event (e.g., a wall switch) tended to produce signals rich in high amplitude components in the lower frequency range (100 Hz-5 KHz). Inductive loads featuring a solid state switching mechanism generally produced continuous noise in the 5 kHz-1 MHz range. Inductive loads with mechanically switched voltages produce noise near 60 Hz, but the data collection module 12 filtered out much of that noise. Thus, analysis of the frequency spectrum may be broken up into two parts. The lower frequency space (100 Hz-5 kHz) is effective for analysis of transient noise events, such as those produced by wall switches. The higher frequency is better for continuous noise events, such as those produced by TRIACs and switching power supplies. It was observed that dim levels can also be gathered from the continuous noise frequency generated by TRIACs.

Detecting and Learning the Signals

The detection approach requires detection of the transient pulse of electrical noise followed by extraction of relevant features for learning classification.

Detecting Transient Pulses

The filtering hardware in the power line interface module 12 removes most of the high frequency noise. Some broadband noise is always present, but typically at low amplitudes. To detect the transient pulses, a simple sliding window algorithm was employed to look for drastic changes in the input line noise (both beginning and end). These drastic changes, lasting only a few microseconds, are labeled as candidate signals and are processed further. The sliding window algorithm acquires a 1-microsecond sample, which is averaged from data acquired after performing the FFT on data from the power line interface module 12. Each sample includes frequency components and associated amplitude values in vector form. Each vector includes amplitude values for frequency intervals ranging between 0 and 50 kHz. The Euclidean distance between the previous vector and the current window's vector is then computed. When the distance exceeds a predetermined threshold value, the start of a transient is marked. The window continues to slide until there is another drastic change in the Euclidean distance (the end of the transient). Although the threshold value was determined through experimentation, the thresholds can be readily learned and adapted over time.

After having isolated the transient, there are N vectors of length L, where N is the pulse width in 1 microsecond increments and L is the number of frequency components (2048 for example). A new vector of length L+1 is then constructed by averaging the corresponding N values for each frequency components. The (L+1)th value is N, the width of the transient. This value then serves as a feature vector for that particular transient.

Learning the Transients

For the learning algorithm, a support vector machine (SVM) was employed, such as is discussed by Burges, C. J. C., "A Tutorial on Support Vector Machines for Pattern Recognition," Journal of Data Mining and Knowledge Discovery, Vol. 2, No. 2, Springer Press, June 1998.

SVMs perform classification by constructing an N-dimensional hyperplane that optimally separates the data into multiple categories. The separation is chosen to have the largest distance from the hyperplane to the nearest positive and negative examples. Thus, the classification is appropriate for testing data that is near, but not identical, to the training data as is the case of the feature vectors for the transients. SVMs are appealing because the feature space is fairly large compared to the potential training set. Because SVMs employ overfitting protection, which does not necessarily depend upon the number of features, they have the ability to better handle large feature spaces. The feature vectors are used as the support vectors in the SVM. The Weka toolkit was used to construct an SVM, using labeled training data to later classify the query points.

Feasibility and Performance Evaluation

To evaluate the feasibility and performance of the disclosed approach, it was tested in six different homes 20 of varying styles, age, sizes, and locations. The transient isolation approach was first tested in a single home. Next, a feasibility study was conducted in that home 20 for a six-week period to determine the classification accuracy of various electrical events over an extended period of time. Finally, for five other homes 20, a one-week study was conducted to reproduce the results from the first home 20.

Transient Isolation Evaluation

To evaluate the feasibility of our automatic transient detection approach, data was collected from one home 20 for a four-hour period and had the software 30 continuously isolate transient signals. During that period, various electrical components were actuated and their timestamps were noted. A total of 100 distinct events were generated during this period. For each event, it was then determined if a transient was isolated successfully at the noted times. Table 2 shows results of five different four-hour sessions. The percentage of successfully identified transients out of the number of event triggers are shown in Table 2. We believe the reason for the missed events was because of our static threshold algorithm. An adaptive threshold approach would mitigate this problem.

TABLE 2

| Test 1 (% found) | Test 2 (% found) | Test 3 (% found) | Test 4 (% found) | Test 5 (% found) |
| --- | --- | --- | --- | --- |
| 98 | 93 | 91 | 88 | 96 |

Classifying Transient Events in Various Homes

The aim of the six-week evaluation was to determine the classification accuracy of various types of electrical devices 21 and how often the apparatus 10 needed to be retrained (i.e., signal stability over time). The other five deployments were used to show that events similar to those of the initial home 20 could be detected and to show that the transient noise signatures were temporally stable in other homes 20. Despite the small number of homes 20, a variety of homes and sizes were tested, including older homes with and without recently updated electrical systems (see Table). An apartment home 20 in a six-story building was also included, and its electrical infrastructure 11 was somewhat different from that of a single family home 20. The types of electrical devices listed in Table 1 were tested, so it was ensured that the homes 20 in which the apparatus 10 was deployed had most of these devices 21.

For the entire testing period, the data collection module 12 was installed in the same electrical outlet. For Home 1, data was collected and labeled at least three times per week during the six-week period. The data collection process involved running the apparatus 10 and toggling various predetermined electrical devices 21 (see Table 1 for examples). For each device 21 that was toggled, each on-to-off and off-to-on event was manually labeled. In addition, at least two instances of each event was captured during each session. For Home 1, 41 different devices 21 were selected for testing (82 distinct events) and collected approximately 500 instances during each week. Thus, approximately 3000 labeled samples were collected during the six-week period.

Data was collected and labeled in a similar manner for the shorter one-week deployments. Training data was collected at the beginning of the week and additional test data was collected at the end of the week. At least 4 instances of each event were gathered for the training set. Because control of the events was possible, the number of distinct events were fairly equally distributed among the data and not biased towards a single device 21 or switch for all the 6 homes 21.

Table 3 presents descriptions of homes 20 in which the apparatus 10 was deployed. Home 1 was used to conduct the long-term six-week deployment.

TABLE 3

| Home | Year Built | Electrical Remodel Year | Floors/ Total Size (Sq Ft)/(Sq M) | Style | Bedrooms/ Bathrooms/ Total Rms. | Deployment Time (weeks) |
| --- | --- | --- | --- | --- | --- | --- |
| 1 | 2003 | 2003 | 3/4000/371 | 1 Family | 4/4/13 | 6 |
| 2 | 2001 | 2001 | 3/5000/464 | 1 Family | 5/5/17 | 1 |
| 3 | 1999 | 1999 | 1/700/58 | 1 Bed Apt | 1/1/4 | 1 |
| 4 | 2002 | 2002 | 3/2600/241 | 1 Family | 3/3/12 | 1 |
| 5 | 1935 | 1991 | 1/1100/102 | 1 Family | 2/1/7 | 1 |
| 6 | 1967 | 1981 | 1/1500/140 | 1 Family | 2/1/7 | 1 |

Tables 4 and 5 show classification accuracies for the different homes we tested. For Home 1, the classification accuracy of test data gathered at various times during the six weeks is shown using the training set gathered during the first week. The average overall classification accuracy in Home 1 was approximately 85% (Table 4). The accuracy of the classification for varying training set sizes is also shown. Because there can potentially be many events of interest in the home, making the training process an arduous task, it was desirable to find the minimum number of samples that would provide reasonable performance. The results suggest that there is only a slight decrease in classification over the six-week period. The results also suggest that a small number of training instances result in lower classification accuracies.

Table 4 shows performance results of Homes 1. Accuracies are based on the percentage of correctly identified toggled light switches or other events in the test data set. Training happened during week 1, and we reported the accuracies of the classifier _ for test data from subsequent weeks using that initial training set from week 1. Overall classification accuracy of a simple majority classifier was 4%.

TABLE 4

| Training set Size/Instances per event | Week 1 (%) | Week 2 (%) | Week 3 (%) | Week 4 (%) | Week 5 (%) | Week 6 (%) |
| --- | --- | --- | --- | --- | --- | --- |
| 164/2 | 83 | 82 | 81 | 79 | 80 | 79 |
| 246/3 | 86 | 84 | 83 | 84 | 82 | 83 |
| 328/4 | 88 | 91 | 87 | 85 | 86 | 86 |
| 410/5 | 90 | 92 | 91 | 87 | 86 | 87 |

Increasing the number of training instances did increase the classification accuracy. A small number of training samples makes it very important to have accurate training data. Mislabeling of a single training sample can have major impacts on a learned model. For example, the on and off event labels were sometimes flipped for a particular electrical device 21. This highlights the importance of designing a training or calibration scheme that mitigates human error during the training and labeling process.

The results from the one-week deployment in the five other homes 20 are shown in Table 5, and the test data from the end of the week showed promising results. No significant differences in accuracy between old and new homes was observed. The lower classification accuracy for Home 5 was the result of low frequency noise that interfered with transient events.

Table 5 shows performance results of various homes 20. Accuracies are based on the percentage of correctly identified toggled light switches or other events in the test data set. The results of a majority classifier are also shown. For each home 20, the training of the data occurred at the beginning of the week and the test data set was gathered at the end of that week.

TABLE 5

| Home | Distinct Events | Training set (events) | Test set (events) | Accuracy (%) | Majority classif. (%) |
| --- | --- | --- | --- | --- | --- |
| 2 | 32 | 328 | 100 | 87 | 4 |
| 3 | 48 | 192 | 96 | 88 | 6 |
| 4 | 76 | 304 | 103 | 92 | 3 |
| 5 | 64 | 256 | 94 | 84 | 3 |
| 4 | 38 | 152 | 80 | 90 | 8 |

In the current implementation, the lower frequency spectrum was analyzed where solid-state switching devices would produce the lowest interference from potential continuous noise. Looking at a larger frequency spectrum provides better classification for certain transient events. In addition, the apparatus 10 should detect and to adapt to random noise events when looking for transient pulses. The reduced-to-practice apparatus 10 monitored amplitudes of the component frequencies. Phase difference between component frequencies, however, may also be considered as part of a feature extraction scheme.

Another consideration relates to scaling of the approach. Although unlikely in domestic settings, compound events, such as two lights toggled simultaneously, can produce errors in classification because their combined transient noises produce different feature vectors. This type of event is more of a concern in a very large home with many residents, or in an apartment building that does not have individually metered units. If users regularly flip light switches nearly simultaneously, this may be trained as a separate event that is distinct from those of individual switches.

The reduced-to-practice implementation of the apparatus 10 focuses on domestic environments, but the apparatus 10 can also be used in commercial settings. Compound events and electrical noise in these settings may become a more significant issue. Another issue is that the electrical lines may be so long that the noise does not reach the analyzer. Commercial buildings typically have multiple electrical legs, and to mitigate problems with compound events and line distance, multiple line noise analyzers may be installed throughout an office building to isolate the analysis to certain sections of the building. In order to scale to the commercial environments, the entire frequency band may be used.

The apparatus 10 is more appropriate for detecting and learning fixed electrical devices as compared to mobile or portable devices. Portable devices require training the apparatus 10 using any possible outlet that the portable device may be plugged into. In addition, plugging the portable device into an extension cord or power strip might produce a fingerprint different from one obtained by plugging it directly into an electrical outlet. With a well-defined set of events that should be detected, a suitable training plan can readily be devised, although it may be time-consuming as the set grows larger.

The apparatus 10 does not require deployment of a large number of data collection modules 12 throughout a home 20. A single data collection module 12 is easier to physically deploy and maintain than a large array of distributed sensors. This simplicity of physical installation and maintenance has its cost in terms of training the machine learning algorithm 30 to recognize a significant number of electrical loads.

Thus, an approach that provides for a low-cost and easy-to-install power line event detection apparatus 10 that is capable of identifying certain electrical events, such as switches that are toggled has been disclosed. This apparatus 10 has implications for applications requiring simple activity detection, home automation systems, and energy usage information. The apparatus 10 learns and classifies unique electrical events with high accuracy using standard machine learning techniques. Additionally, deployment of the apparatus 10 in several homes 20 showed long-term stability and the ability to detect events in a variety of different types of homes 20. The apparatus 10 has the potential to be integrated easily into existing applications that aim to provide services based on detection of various levels of activity.

FIG. 7 illustrates an active embodiment of the electrical device actuation detection apparatus 10. This embodiment of the apparatus 10 may comprise an interrogator module 10a and a receiver module 10b that are coupled to the power line infrastructure 11. Although illustrated as separate components, it is to be understood that the interrogator and receiver modules 10a, 10b may be implemented as a single interrogator-receiver module 10c containing transmitter and receiver sections. The interrogator and receiver modules 10a, 10b, or the interrogator-receiver module 10c, are plugged into an electrical receptacle of the power line infrastructure 11. An electrical device 21, such as an appliance 21, for example, is also coupled to the power line infrastructure 11.

In operation, the interrogator module 10a, or the transmitter portion of the interrogator-receiver module 10c, sends a known broadband reference signal, or interrogation signal, over the power line infrastructure 11 (up to 9 vpp, for example). The receiver section of the interrogator-receiver module 10c, or the receiver module 10b, connected to the power line infrastructure 11, listens for the signal and determines if it has changed relative to the reference signal (i.e., changed signal). Any change in the interrogation or reference signal is the result of the on-off status of the electrical device 21, or appliance 21, connected to the power line infrastructure 11. The signal values corresponding to the on-off status of the electrical device 21 are recorded in a database during a calibration process. The interrogator module 10a, or the interrogator-receiver module 10c, then looks for the closest match in the database to identify the associated electrical device 21 and its state.

In summary, disclosed are apparatus 10 and methods 40 that identify actuated electrical devices 21 coupled to an electrical power line infrastructure 11 using electrical noise signals generated by the devices 21. The apparatus 10 is embodied in computer apparatus 12, 15, 17 coupled to the electrical power line infrastructure 11 that identifies noise signatures associated with electrical switching devices 21 and loads 21 that are transmitted over the electrical power line infrastructure 11 to determine the on-off status of the one or more switching devices 21 and loads 21. The computer apparatus 12, 15, 17 comprises software 30 that records noise signatures identifying each of the switching devices 21 and loads 21 as they are turned on and off, and identifies switching devices 21 and loads 21 that are actuated by comparing a noise signature transmitted over the electrical power line infrastructure 11 with the recorded noise signatures.

The electrical noise signals are filtered 31 by a power line interface 12 and the filtered electrical noise signals are fast Fourier transformed 32 to generate voltage versus frequency data associated with an actuated device 21. Thus, electrical noise transmitted over the power line infrastructure is monitored to detect electrical noise patterns that correspond to the actuated electrical devices 21. The electrical noise patterns are processed 33 to construct unique electrical noise signatures associated with the actuated electrical devices 21. The unique electrical noise signature may be processed 34 to store it in a database, or an electrical noise signature that is stored in the database that corresponds to the generated electrical noise signature may be processed 34 to retrieve it from the database, and the signatures and related data may be displayed. The noise signature data may be remotely transferred to a central database for power consumption analysis. The data stored in the database may also be presents in a graphical user interface indicating when and how often an electrical device 21 is switched on and off.

In exemplary methods, one or more electrical devices are to an electrical power line infrastructure by way of one or more switching devices. Electrical noise transmitted over the power line infrastructure is monitored. Electrical noise patterns in the monitored electrical noise are detected that corresponds to actuation of each of the one or more electrical devices. The detected electrical noise patterns are processed to generate a unique electrical signature that identifies which of the electrical devices is actuated.

Thus, electrical device actuation detection apparatus and methods have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

We claim:

1. An apparatus configured to detect a change in an electrical state of one or more electrical devices, the one or more electrical devices are coupled to an electrical power infrastructure and generate transient electrical noise on the electrical power infrastructure, the apparatus comprises:

a processing module configured to run on a processor of a computational unit; and a sensing device configured to be coupled to an electrical outlet, the sensing device comprising:

a data acquisition receiver configured to receive the transient electrical noise via the electrical outlet when the sensing device is coupled to the electrical outlet, and further configured to convert the transient electrical noise into one or more first data signals, wherein:

the electrical outlet is electrically coupled to the electrical power infrastructure;

the sensing device is in communication with the processing module; and the processing module is further configured to identify the change in the electrical state of the one or more electrical devices at least in part by using the one or more first data signals.

2. The apparatus of claim 1, wherein:
the processing module is further configured to determine electrical power consumed by the one or more electrical devices at least in part by using the one or more first data signals.

3. The apparatus of claim 1, wherein:
the processing module is configured to identify when a first one of the one or more electrical devices is turned on or turned off at least in part by using the one or more first data signals.

4. The apparatus of claim 1, wherein:
the transient electrical noise comprises one or more electrical pulses on the electrical power infrastructure; and
the one or more electrical pulses are identifiable on the electrical power infrastructure for a length of time of less than ten microseconds.

5. The apparatus of claim 1, wherein:
the data acquisition receiver comprises:
one or more filters configured to pass at least a portion of the transient electrical noise; and
a data conversion module configured to receive the transient electrical noise from the one or more filters, apply one or more predetermined processing algorithms to the transient electrical noise that is filtered by the one or more filters, and output the one or more first data signals to the processing module.

6. The apparatus of claim 5, wherein:
the one or more filters comprise:
a 60 hertz filter; and
a bandpass filter with a passband of:
100 hertz to 100 kilohertz; or
10 kilohertz to 100 megahertz.

7. The apparatus of claim 5, wherein:
the data conversion module is configured to apply a fast Fourier transform to the transient electrical noise received from the one or more filters; and
the one or more predetermined processing algorithms comprise the fast Fourier transform.

8. The apparatus of claim 1, wherein:
the processing module comprises:
an event detection module configured to use the one or more first data signals to determine whether one or more electrical events have occurred;
a classification module configured to determine the change in the electrical state of the one or more electrical devices at least in party by using the one or more electrical events; and
a training module configured to correlate a first type of event with a first event of the one or more electrical events and a second type of event with a second event of the one or more electrical events.

9. The apparatus of claim 1, wherein:
the processing module is further configured to perform one or more transformations to the one or more first data signals to separate out at least two component frequencies of the one or more first data signals; and the processing module is further configured to perform a machine learning process to the at least two component frequencies of the one or more first data signals to identify the change in the electrical state of the one or more electrical devices.

10. The apparatus of claim 1, wherein:
the sensing device further comprises:
a transmitter configured to transmit a reference signal over the electrical power line infrastructure via the electrical outlet when the sensing device is coupled to the electrical outlet, the reference signal interacts with a first device of the one or more electrical devices to create the transient electrical noise.

11. A method of detecting and classifying electrical power usage by one or more electrical devices, the one or more electrical devices are coupled to an electrical power line, the method comprising:

capturing one or more first electrical signals on the electrical power line, the one or more first electrical signals comprise first transient electrical noise;

after capturing the one or more first electrical signals, using the first transient electrical noise in the one or more first electrical signals to train a computational unit to associate one or more electrical events with the electrical power usage by the one or more electrical devices;

capturing one or more second electrical signals on the electrical power line, the one or more second electrical signals comprise second transient electrical noise;

detecting an occurrence of the one or more electrical events on the electrical power line using at least in part the second transient electrical noise in the one or more second electrical signals; and using the computational unit to associate the occurrence of the one or more electrical events with a change in an electrical state of at least one device of the one or more electrical devices.

12. The method of claim 11, wherein:
using the computational unit to associate the occurrence of the one or more electrical events with the change in the electrical state comprises:
associating the one or more electrical events with a switching-on or switching-off of the at least one device of the one or more electrical devices.

13. The method of claim 11, wherein:
using the computational unit to associate the occurrence of the one or more electrical events with the change in the electrical state comprises:
associating the one or more electrical events with the change in the electrical state from a first state providing a first level of electrical power to the at least one device of the one or more electrical devices to a second state providing a second level of electrical power to the at least one device of the one or more electrical devices.

14. The method of claim 11, wherein:
using the computational unit to associate the one or more electrical events with the change in the electrical state comprises:
performing one or more transformations to the one or more second electrical signals to separate out at least two component frequencies of the one or more second electrical signals; and
performing a machine learning process to the at least two component frequencies of the one or more second electrical signals to identify the change in the electrical state of the at least one device of the one or more electrical devices.

15. The method of claim 11, wherein:
the first transient electrical noise in the one or more first electrical signals comprises first electrical pulses on the electrical power line;
the first electrical pulses are identifiable on the electrical power line for a first length of time less than ten microseconds;
the second transient electrical noise in the one or more second electrical signals comprises second electrical pulses on the electrical power line; and
the second electrical pulses are identifiable on the electrical power line for a second length of time less than ten microseconds.

16. The method of claim 11, further comprising:
coupling a sensing device to an electrical wall outlet of a structure, wherein:
the electrical wall outlet is electrically coupled to the electrical power line; and
capturing the one or more first electrical signals comprises:
capturing the one or more first electrical signals using the sensing device coupled to the electrical wall outlet of the structure; and
capturing the one or more second electrical signals comprises:
capturing the one or more second electrical signals using the sensing device coupled to the electrical wall outlet of the structure.

17. The method of claim 11, further comprising:
before capturing the one or more first electrical signals, transmitting a first reference signal over the electrical power line, the first reference signal interacts with a first device of the one or more electrical devices to create the first transient electrical noise in the one or more first electrical signals; and
before capturing the one or more second electrical signals, transmitting a second reference signal over the electrical power line, the second reference signal interacts with the first device of the one or more electrical devices to create the second transient electrical noise in the one or more second electrical signals.

18. An electrical state change detection device configured to detect a change in an electrical state of one or more electrical devices, the one or more electrical devices are coupled to an electrical power infrastructure, the electrical state change detection device comprises:
a power line interface module configured to couple to the electrical power infrastructure, the power line interface module comprising:
a transmitter configured to couple to the electrical power infrastructure and further configured to transmit an interrogation signal over the electrical power infrastructure, the interrogation signal interacts with a first device of the one or more electrical devices to create a modified interrogation signal; and
a receiver configured to couple to the electrical power infrastructure and further configured to receive the modified interrogation signal;
one or more filter circuits coupled to the power line interface module and configured to pass one or more portions of the modified interrogation signal;
a converter module coupled to an output of the one or more filter circuits and configured to convert the modified interrogation signal into one or more data signals, the one or more data signals comprise information regarding electrical noise of the modified interrogation signal; and
a processing module configured to run on a processor of a computational unit, the processing module is further configured to identify the change in the electrical state of the one or more electrical devices at least in part by using the one or more data signals.

19. The electrical state change detection device of claim 18, wherein:
the processing module comprises:
an signature module configured to run on the processor of the computational unit and further configured to use the information regarding the electrical noise of the modified interrogation signal to create one or more noise signatures; and
an event classification module configured to run on the processor of the computational unit and further configured to use the one or more noise signatures to determine whether the change in the electrical state of the one or more electrical devices has occurred and to determine an event type of the change in the electrical state of the one or more electrical devices.

20. The electrical state change detection device of claim 18, wherein:
the transmitter and the receiver of the power line interface module are separate components;
the transmitter is configured to be coupled to the electrical power infrastructure at a first electrical outlet;
the receiver is configured to be coupled to the electrical power infrastructure at a second electrical outlet different from the first electrical outlet; and
the first electrical outlet and the second electrical outlet are electrically coupled to the electrical power infrastructure.

21. The electrical state change detection device of claim 18, wherein:
the transmitter and the receiver of the power line interface module are a single component and are configured to be coupled to the electrical power infrastructure at a single electrical outlet;
the single electrical outlet is electrically coupled to the electrical power infrastructure;
the electrical power infrastructure comprises multiple electrical outlets; and
the multiple electrical outlets comprise the single electrical outlet.

* * * * *

UNITED STATES PATENT AND TRADEMARK OFFICE
CERTIFICATE OF CORRECTION

PATENT NO. : 8,334,784 B2  
APPLICATION NO. : 13/335045  
DATED : December 18, 2012  
INVENTOR(S) : Shwetak N. Patel et al.

Page 1 of 1

It is certified that error appears in the above-identified patent and that said Letters Patent is hereby corrected as shown below:

Title Page, item (73) Assignee should read as follows: Georgia Tech Research Corporation, Atlanta, GA (US)

Signed and Sealed this  
Twenty-fifth Day of August, 2015

Michelle K. Lee  
*Director of the United States Patent and Trademark Office*